United States Patent [19]

Mochizuki et al.

[11] 4,154,632

[45] May 15, 1979

[54] METHOD OF DIFFUSING ALUMINUM INTO SILICON SUBSTRATE FOR MANUFACTURING SEMICONDUCTOR DEVICE

[75] Inventors: Yasuhiro Mochizuki; Hiroaki Hachino; Yutaka Misawa, all of Hitachi, Japan

[73] Assignee: Hitachi, Ltd., Japan

[21] Appl. No.: 931,390

[22] Filed: Aug. 7, 1978

[30] Foreign Application Priority Data

Aug. 12, 1977 [JP] Japan ................................. 52-96003

[51] Int. Cl.² ........................................... H01L 21/225
[52] U.S. Cl. .................................... 148/178; 148/187; 148/188
[58] Field of Search ........................ 148/178, 187, 188

[56] References Cited

U.S. PATENT DOCUMENTS

| | | | |
|---|---|---|---|
| 3,895,975 | 7/1975 | Lindmayer | 148/178 |
| 3,936,319 | 2/1976 | Anthony et al. | 148/187 X |
| 4,040,878 | 8/1977 | Rowe | 148/188 |

*Primary Examiner*—G. Ozaki
*Attorney, Agent, or Firm*—Craig & Antonelli

[57] ABSTRACT

An aluminum diffusion source layer is formed by vacuum evaporation on a major surface of a silicon substrate. The silicon substrate is heated to form an aluminum-silicon alloy layer, an aluminum doped silicon recrystallization layer and an aluminum diffusion layer. Thereafter, the aluminum-silicon alloy layer is removed from the major surface of the silicon substrate. Drive-in diffusion is performed so as to diffuse, aluminum included in the silicon recrystallization layer and the aluminum diffusion layer, into the silicon substrate. As a result, the aluminum diffusion concentration of $10^{16}$–$10^{19}$ atoms/cm³ can be obtained.

3 Claims, 9 Drawing Figures

METHOD OF DIFFUSING ALUMINUM INTO SILICON SUBSTRATE FOR MANUFACTURING SEMICONDUCTOR DEVICE

BACKGROUND OF THE INVENTION

The present invention relates to a method of diffusing aluminum into a silicon substrate for manufacturing a semiconductor device.

Usually, boron, aluminum or gallium is used as a P-type dopant in a silicon substrate. Aluminum among these dopants is most useful for the formation of a diffusion layer since aluminum has the highest rate of diffusion into silicon. Namely, the diffusion coefficient of aluminum in silicon is ten to twenty times as large as that of boron and several times as large as that of gallium. Therefore, the time required for forming a diffusion layer of a predetermined depth by use of aluminum is one-tenth to one-twentieth of that required in the case of using boron and a half to one-tenth of that required in the case of using gallium.

The aluminum dopant is also advantageous because of a low rate of occurrence of crystal lattice distortion in silicon and a small interaction with other dopants. However, the diffusion of aluminum into a silicon substrate has many questions upon which there are difficult in view of technical point. Especially, a highly accurate control of aluminum diffusion concentration is difficult. A typical conventional method of diffusing aluminum into a silicon substrate includes introducing the silicon substrate and an aluminum diffusion source into an evacuated heat-resistive chamber such as quartz and heating the chamber to diffuse evaporated aluminum of a gas phase into the silicon substrate.

The maximum diffusion concentration of aluminum in the silicon substrate is greatly changeable depending upon a vessel for holding the aluminum diffusion source. When a wire of aluminum having a purity of 99.995% is used as the diffusion source and alumina is used the diffusion source holding vessel material, the maximum aluminum diffusion concentration of $10^{19}$ atoms/cm$^3$ can be obtained. However, when silicon or quartz is used as the holding vessel material, the maximum aluminum diffusion concentration is below $10^{17}$ atoms/cm$^3$.

The maximum aluminum diffusion concentration in the silicon substrate is also greatly changeable depending upon the composition of the aluminum diffusion source. For example, in the case where a silicon-aluminum alloy is used as the diffusion source, the aluminum diffusion concentration of about $10^{19}$ atoms/cm$^3$ can be obtained when the concentration of aluminum in the diffusion source is above 65% (i.e. the concentration of silicon is below 35%). But, when the aluminum concentration of aluminum in the diffusion source is below 60% (i.e. the concentration of silicon is above 40%), the obtained aluminum diffusion concentration would be in order of about $10^{16}$ atoms/cm$^3$. Therefore, it is difficult to accurately control the diffusion concentration over a range of $10^{17}$-$10^{19}$ atoms/cm$^3$.

In the vapour phase diffusion of aluminum within a quartz chamber, a part of the aluminum vapour is consumed by the reaction thereof with quartz of the chamber. When the quantity of the aluminum vapour in the quartz is sufficient, aluminum can be diffused into the silicon substrate with a concentration of about $10^{19}$ atoms/cm$^3$ which is a limit at which aluminum is soluble in its solid state into silicon (i.e. the maximum solid-solubility of aluminum into silicon). However, the quantity of the aluminum vapour in the quartz chamber is not sufficient, aluminum can be merely diffused into the silicon substrate with a concentration of at highest about $10^{16}$ atoms/cm$^3$. Thus, in the conventional vapour diffusion method, it is generally difficult to accurately obtain an aluminum diffusion concentration of $10^{17}$-$10^{19}$ atoms/cm$^3$ which is practically useful.

A two-step diffusion technique using a preposition diffusion step and a drive-in diffusion step is known as a diffusion method which can provide a low diffusion concentration. In accordance with this technique, however, if the diffusion concentration at the preposition diffusion step is selected to be low, the fluctuation of diffusion concentration or diffusion depth becomes large, thereby making an accurate control of diffusion concentration over a wide range difficult. Therefore, there has been proposed a method in which a pattern of aluminum formed or deposited on a surface of a silicon substrate by means of evaporation techniques, etc. is used as a diffusion source. Such a method is described in U.S. Pat. No. 4,040,878 issued on Aug. 9, 1977. In accordance with this method, however, the aluminum surface concentration of the silicon substrate reaches the maximum solid-solubility of aluminum into silicon. As a result, it is difficult to form a low concentration diffusion layer in the silicon substrate. Further, it is difficult to accurately control the concentration of diffusion of aluminum into the silicon substrate in accordance with the thickness of the deposited aluminum pattern or layer, since the resultant diffusion concentration fluctuates. Furthermore, the deposited aluminum layer is oxidized during the thermal diffusion process to produce a surface layer of α-alumina so that the surface flatness of the silicon substrate is remarkably deteriorated. The α-alumina layer which is difficult of chemical dissolution, is undesirable.

SUMMARY OF THE INVENTION

An object of the present invention is to provide a semiconductor device manufacturing method in which aluminum can be accurately diffused into a silicon substrate with a concentration over a wide range.

Another object of the present invention is to provide a method of selectively diffusing aluminum into only a desired region of a silicon substrate.

According to the present invention, an aluminum layer as a diffusion source is formed in a predetermined pattern on a major surface of a silicon substrate. The silicon substrate is subjected to a proper heat treatment so that aluminum of the diffusion source layer and silicon of the substrate form an aluminum-silicon alloy layer. At the same time, an aluminum doped silicon recrystallization layer and an aluminum diffusion layer are formed in the substrate. Thereafter, any excess aluminum diffusion source including the aluminum-silicon alloy layer and an oxide film formed on the surface of the silicon substrate are etched away. The silicon substrate is again heated to diffuse or drive, aluminum included in the aluminum doped silicon recrystallization layer and the aluminum diffusion layer, into the silicon substrate over a predetermined depth.

A proper technique of forming the aluminum diffusion source layer on the major surface of the silicon substrate is vacuum evaporation. The thickness of the deposited aluminum diffusion source layer influences the aluminum diffusion concentration; namely, an aluminum diffusion layer can be more deeply formed with a higher diffusion concentration with the increased thickness of the deposited aluminum diffusion source layer. However, since the aluminum diffusion source layer having a thickness larger than 2 microns drips on the silicon substrate at the heat treatment thereof so that the aluminum pattern is deformed, it is preferable that the thickness of the aluminum diffusion source layer is selected to be equal to or smaller than 2 microns.

The pattern of aluminum layer is formed by means of a usual masking and deposition technique or photolithographic technique.

Preferred heat treatment conditions for the formation of the aluminum-silicon alloy layer and the aluminum doped silicon recrystallization layer are as follows. First, a gaseous stream or flow containing an oxidative gas such as oxygen or aqueous vapor is preferable for an atmosphere used in the heat treatment. The reason is that if a non-oxidative atmosphere is used, aluminum may evaporate and deposit on that region of the silicon substrate surface in which diffusion is not desired. When the oxidative atmosphere is used, the surface oxidization of the aluminum layer prevents the spattering of aluminum vapour and a silicon oxide film is formed on a surface portion of the silicon substrate uncovered by the aluminum layer to protect that surface portion from contamination. Second, a temperature equal to or lower than 1200° C. is preferable for the heat treatment. The reason is that if the heat treatment temperature is selected to be higher than 1200° C., there is formed a stable α-aluminum oxide which is difficult to removal by chemical dissolution. The heat treatment temperature is an important factor determining the aluminum diffusion concentration and will be discussed in detail with respect to the hereinlater-described embodiments.

After the heat treatment for forming the aluminum-silicon alloy layer and the aluminum doped silicon recrystallization layer, the silicon substrate is subjected to phosphoric acid and then aqua regia to etch away alumina or any excess aluminum diffusion source including the oxide film and the aluminum-silicon alloy layer.

In the drive-in diffusion process, the excess aluminum diffusion source exists no longer. Therefore, a heat treatment at a temperature higher than 1200° C. is possible. As a result, the diffusion depth can be accurately controlled.

DESCRIPTION OF THE PREFERRED EMBODIMENTS

Now, the embodiments of the present invention will be described by way of some examples.

EXAMPLE 1

Figure 1A:
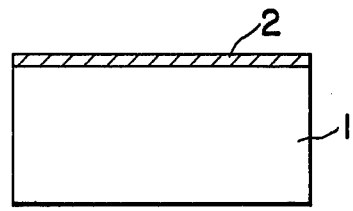
FIGS. 1A to 1E are cross-sectional views of a silicon substrate illustrating a method of manufacturing a semiconductor device according to the present invention.
Figure 1B:
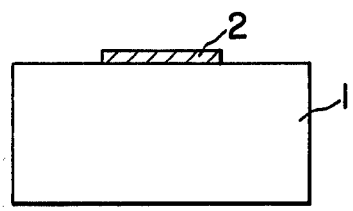
Figure 1C:
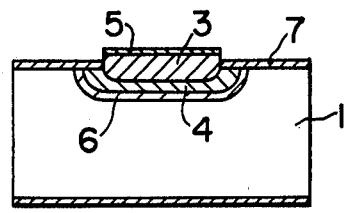
Figure 1D:
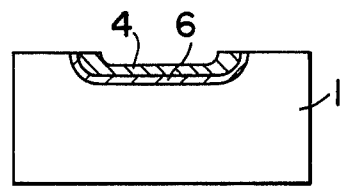
Figure 1E:
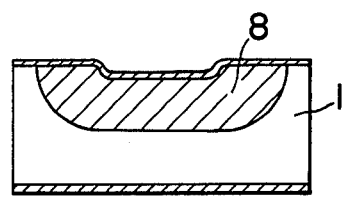

As shown in FIG. 1A, an aluminum layer 2 of 9500 Å thickness as a diffusion source was deposited by vacuum evaporation on a surface of an N-type silicon substrate 1 having a resistivity of 100 Ω·cm. Thereafter, the deposited aluminum layer was etched away by photolithographic techniques, leaving a circular pattern portion having its diameter of 3 mm, as shown in FIG. 1B. The silicon substrate was subjected to a heat treatment in an oxygen flow at 920° C. and for one hour to form an aluminum-silicon alloy layer 3, an aluminum doped silicon recrystallization layer 4, an alumina layer 5, an aluminum diffusion layer 6 and a silicon oxide film 7, as shown in FIG. 1C. The resultant structure was then subjected to a hydrofluoric acid, a hot phosphoric acid and a hot aqua regia in this order to dissolve and etch away any excess aluminum diffusion source including the silicon oxide film 7, the alumina layer 5 and the aluminum-silicon alloy layer 3 (see FIG. 1D). A drive-in diffusion process was performed in an oxygen flow at 1250° C. and for six hours. As a result, an aluminum diffusion layer 8 was formed in which the maximum diffusion concentration of aluminum is $1 \times 10^{17}$ atoms/cm$^3$ and the diffusion depth is 75 microns (see FIG. 1E).

Figure 2:
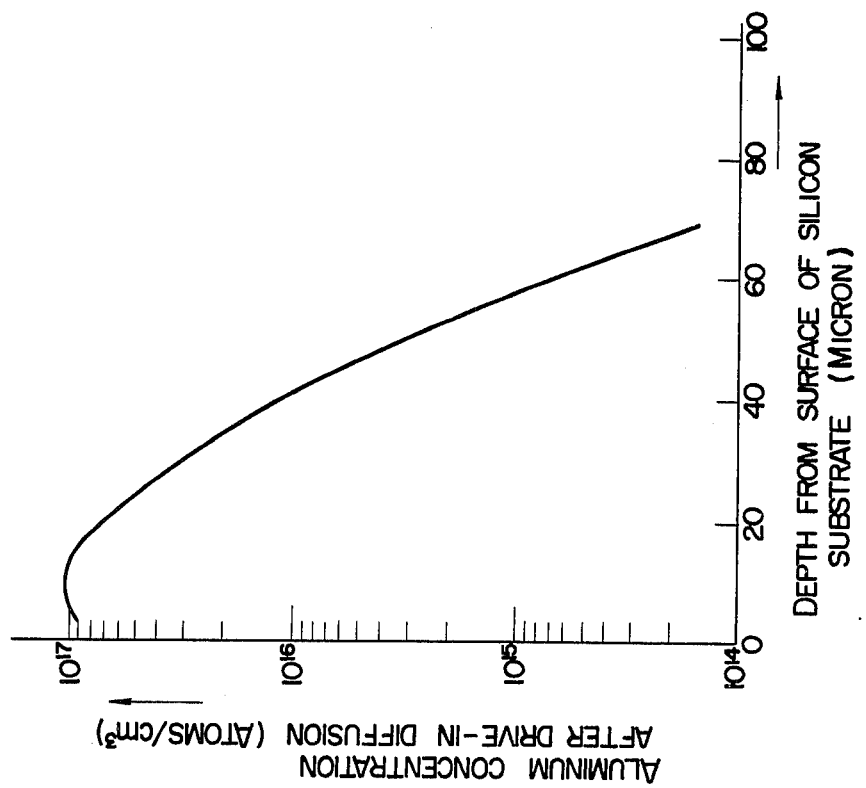
FIG. 2 is a graph showing an example of aluminum diffusion profile of the silicon substrate manufactured by the present invention.

A profile of aluminum diffusion in the thus manufactured silicon substrate is shown in FIG. 2.

EXAMPLE 2

An aluminum layer having a thickness of 1.0 microns was formed in a predetermined pattern by vacuum evaporation on a major surface of each of six N-type silicon substrates having a resistivity of 50 Ω·cm. The six silicon substrate samples were subjected to a heat treatment in an oxygen flow for one hour at temperatures of 800°, 900°, 1000°, 1100°, 1200°, and 1250° C. respectively to form aluminum-silicon alloy and aluminum doped silicon recrystallization layers as shown in FIG. 1C. Each silicon substrate sample was subjected to hydrofluoric acid, hot phosphoric acid and hot aqua regia in this order to dissolve and etch away any excess aluminum diffusion source including silicon oxide, alumina and aluminum-silicon alloy layers. However, it has been found that the silicon substrate sample heated at 1250° C. had difficulties in dissolving the alumina layer and the removal of the underlying aluminum-silicon alloy layer was difficult. The present inventors' observation by X-ray diffraction revealed that a stable α-alumina layer was formed on the silicon substrate surface. Each sample was thereafter subjected to a drive-in diffusion process in an oxygen flow at 1250° C. and for six hours.

Figure 3:
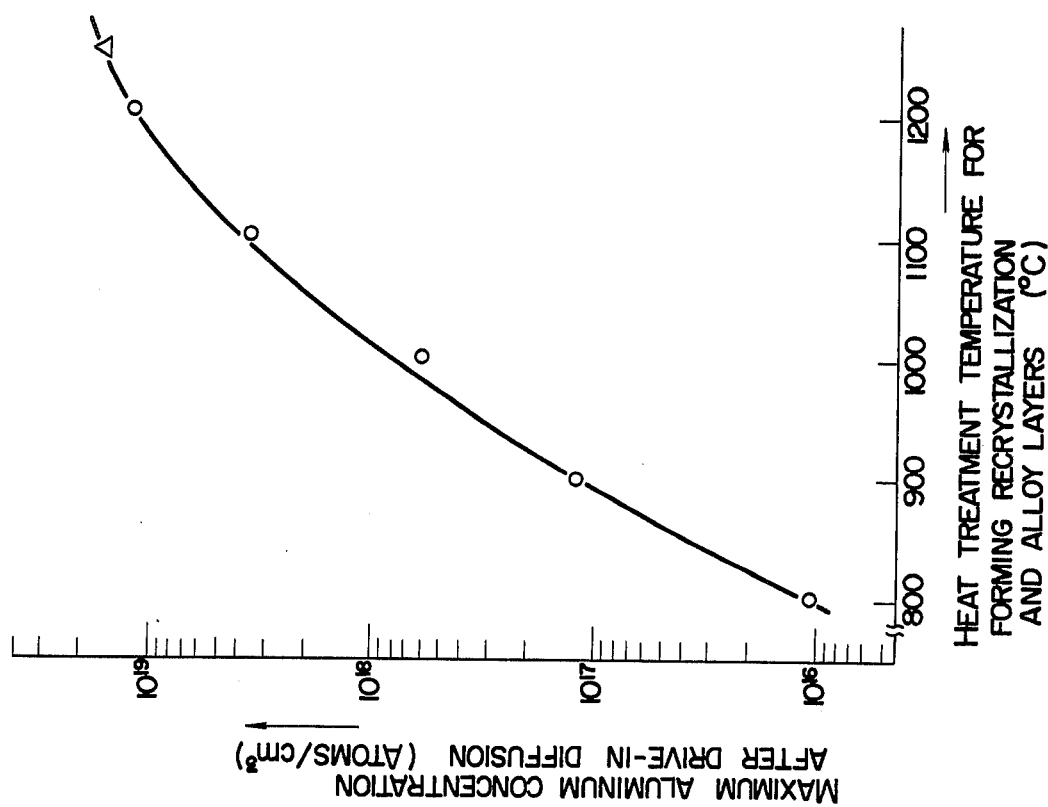
FIG. 3 is a graph showing the relation between the heat treatment temperature for forming the aluminum doped silicon recrystallization layer and the aluminum-silicon alloy layer, and the maximum aluminum concentration after the drive-in diffusion, which was obtained by the manufacturing method according to the present invention.
Figure 4:
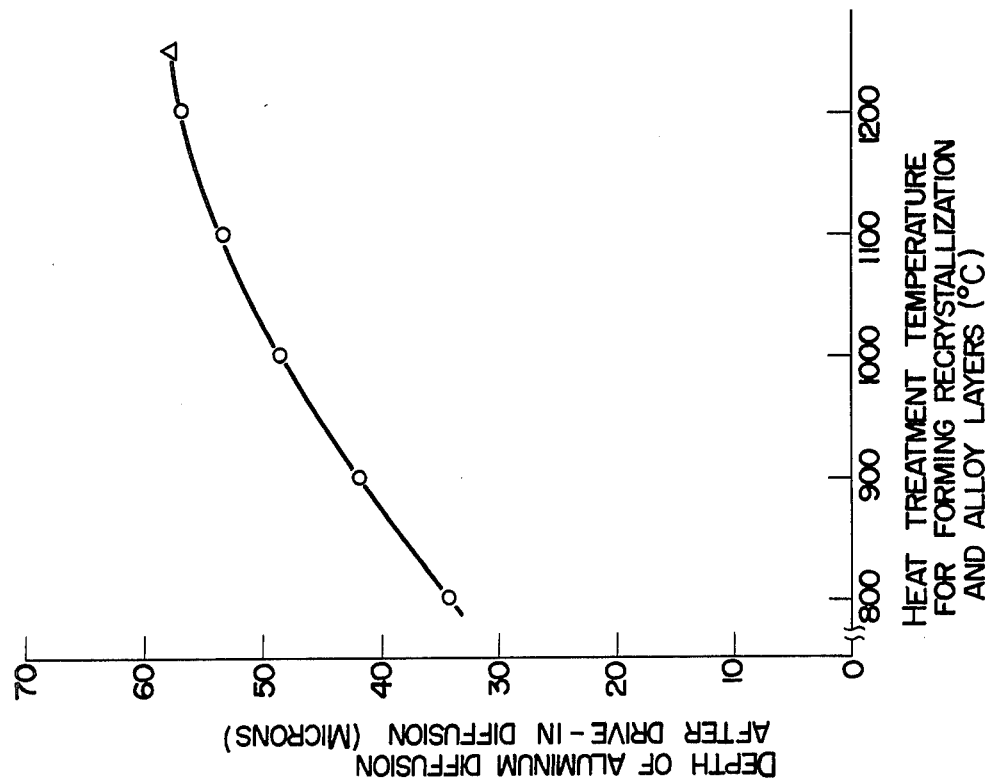
FIG. 4 is a graph illustrating the relation between the heat treatment temperature for forming the aluminum doped silicon recrystallization layer and the aluminum-silicon alloy layer, and the depth of aluminum diffusion, which was obtained by the method according to the present invention.

FIG. 3 shows the relation between the heat treatment temperature for forming aluminum-silicon alloy and aluminum doped silicon recrystallization layers, and the maximum aluminum diffusion concentration after the drive-in diffusion. FIG. 4 shows the relation between the heat treatment temperature and the depth of aluminum diffusion. As seen from FIG. 3, the aluminum diffusion concentration after the drive-in diffusion could be controlled with high accuracy over a wide range of $10^{16}$–$10^{19}$ atoms/cm$^3$ by controlling the heat treatment temperature for forming the alloy and recrystallization layers.

Figure 5:
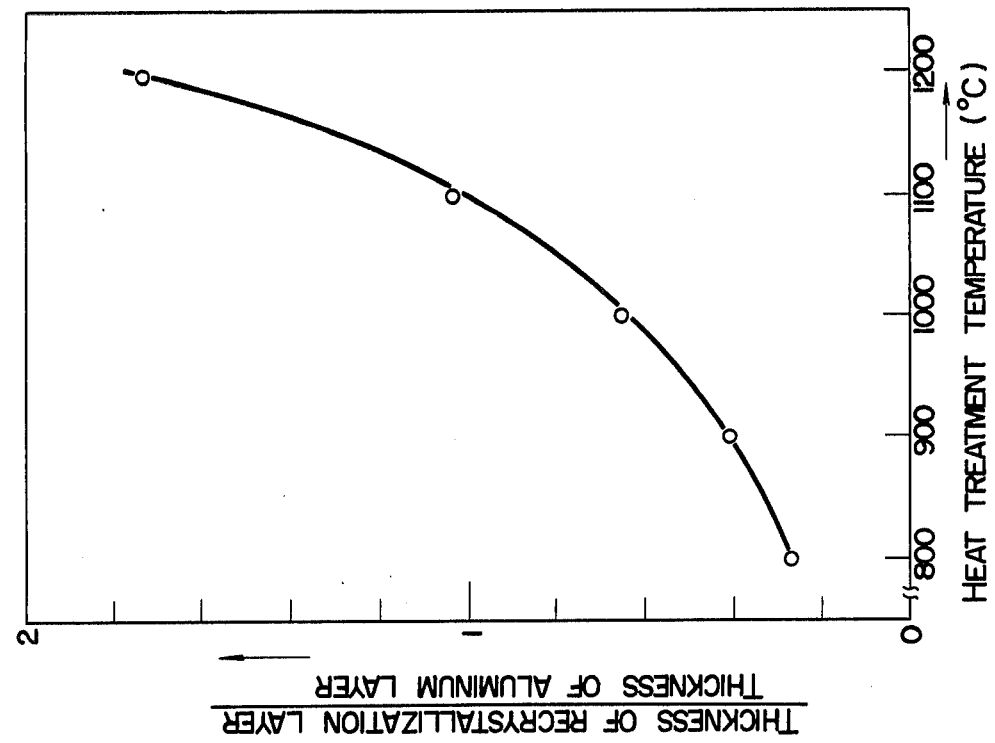
FIG. 5 is a graph illustrating the relation between the heat treatment temperature and the thickness of the formed aluminum doped silicon recrystallization layer, which was obtained by the method according to the present invention.

The aluminum diffusion depth can be controlled by the drive-in diffusion temperature and time. The aluminum diffusion concentration is determined by the quantity of aluminum contained in the aluminum diffusion source or contained in the recrystallization layer and the diffusion layer formed at the first heat treatment. The concentration of aluminum in the recrystallization layer reaches the maximum solid-solubility of aluminum. The thickness of the recrystallization layer is determined by the heat treatment temperature and the thickness of the aluminum layer deposited initially. The relation between the heat treatment temperature and the thickness of the recrystallization layer is shown in FIG. 5. In the figure, the ordinate represents a ratio of the recrystallization layer thickness to the aluminum layer thickness. The recrystallization layer thickness has relations with the heat treatment temperature and the aluminum layer thickness. Thus, the distribution of aluminum diffusion concentration after the drive-in diffusion could be controlled with high accuracy over a wide range by adjusting the heat treatment temperature for the formation of the recrystallization layer.

EXAMPLE 3

A silicon-aluminum alloy layer as an aluminum diffusion source having a thickness of 1.5±0.1 microns was deposited by an electron beam type of vacuum evaporation on a major surface of a N-type silicon substrate having a resistivity of 45–50 Ω·cm. A compound ratio Al/Si in the deposited silicon-aluminum alloy layer was 1/0.8. The alloy layer was patterned by photo-etching techniques to form a circular pattern having its diameter of 940 microns. The resultant structure was subjected to a heat treatment in an oxygen flow at 1000° C. and for one hour to form an alloy diffusion layer and a recrystallization layer. Any excess aluminum diffusion source was etched away and a drive-in diffusion process was thereafter performed. When the silicon-aluminum alloy was used as the aluminum diffusion source, a pattern precision was improved. The reason is that the volume or quantity of dissolution in the silicon substrate is small for the silicon-aluminum alloy layer in comparison with the pure aluminum layer used in the preceeding examples. Namely, in the case where the pattern of the pure aluminum layer is used as the aluminum diffusion source, the removal of the excess aluminum diffusion source by etching after the heat treatment may produce a recess on the silicon substrate surface in accordance with the aluminum layer pattern. The depth of that recess is approximately equal to the thickness of the aluminum layer when the heat treatment temperature is 1000°–1100° C. However, the presence of the recess of such a depth on the silicon substrate surface gives little influence upon the succeeding manufacturing process steps. On the other hand, in the case where the pattern of the silicon-aluminum alloy layer is used as the aluminum diffusion source, the removal of the excess aluminum diffusion source by etching after the heat treatment does not produce any recess on the silicon substrate surface, thereby maintaining the surface flatness of the silicon substrate. Accordingly, when it is desired to manufacture a semiconductor device in which the pattern precision and/or the surface flatness of the silicon substrate are critical, the use of the silicon-aluminum alloy layer as the aluminum diffusion source is preferable.

We claim:

1. A method of diffusing aluminum into a silicon substrate for manufacturing a semiconductor device, comprising the steps of:
   (a) forming an aluminum diffusion source layer in a predetermined pattern on a major surface of said silicon substrate;
   (b) heating said silicon substrate to form an aluminum-silicon alloy layer, an aluminum doped silicon recrystallization layer and an aluminum diffusion layer in accordance with said predetermined pattern;
   (c) thereafter removing said aluminum-silicon alloy layer from said major surface of said silicon substrate; and
   (d) heating said silicon substrate to diffuse, aluminum included in said silicon recrystallization layer and said aluminum diffusion layer into said silicon substrate, to a predetermined depth.

2. A method as claimed in claim 1, wherein the heat treatment temperature at said step (b) is equal to or lower than 1200° C.

3. A method as claimed in claim 1, wherein said aluminum diffusion source layer is composed of one selected from the group consisting of aluminum and aluminum-silicon alloy.

* * * * *